US011270768B2

(12) United States Patent
Xu et al.

(10) Patent No.: US 11,270,768 B2
(45) Date of Patent: Mar. 8, 2022

(54) FAILURE PREVENTION OF CHIP POWER NETWORK

(71) Applicant: INTERNATIONAL BUSINESS MACHINES CORPORATION, Armonk, NY (US)

(72) Inventors: Zheng Xu, Wappingers Falls, NY (US); Kangguo Cheng, Schenectady, NY (US); Dexin Kong, Guilderland, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 93 days.

(21) Appl. No.: 16/808,693

(22) Filed: Mar. 4, 2020

(65) Prior Publication Data

US 2021/0280514 A1 Sep. 9, 2021

(51) Int. Cl.
*G11C 16/04* (2006.01)
*G11C 13/00* (2006.01)
*H01L 23/528* (2006.01)
*H01L 23/525* (2006.01)
*H01L 23/62* (2006.01)

(52) U.S. Cl.
CPC ...... *G11C 13/0059* (2013.01); *G11C 13/0002* (2013.01); *H01L 23/5256* (2013.01); *H01L 23/5286* (2013.01); *H01L 23/62* (2013.01)

(58) Field of Classification Search
CPC ............ G11C 13/0059; G11C 13/0002; H01L 23/5256; H01L 23/5286; H01L 23/62
See application file for complete search history.

(56) References Cited

U.S. PATENT DOCUMENTS

| | | |
|---|---|---|
| 5,319,592 A | 6/1994 | Nguyen |
| 5,789,964 A | 8/1998 | Voldman |
| 6,410,962 B2 | 6/2002 | Geissler et al. |
| 7,411,818 B1 | 8/2008 | Elmegreen et al. |
| 7,531,886 B2 | 5/2009 | Chakravarti et al. |
| 8,730,752 B1 | 5/2014 | Kamalanathan et al. |
| 9,263,218 B2 | 2/2016 | Holzmann |

(Continued)

OTHER PUBLICATIONS

Prakash, A. et al., "TaOx-based resistive switching memories: prospective and challenges" Nanoscale Research Letters (Oct. 2013) pp. 1-17, vol. 8, No. 418.

*Primary Examiner* — Pho M Luu
(74) *Attorney, Agent, or Firm* — Tutunjian & Bitetto, P.C.; Robert Sullivan (57) ABSTRACT

A semiconductor structure is provided. The structure includes a RRAM cell having a first end and a second end. The second end is connected to a first potential. The structure includes a decoupling capacitor having a first end connected in series with the first end of the RRAM cell and a second end connected to a second potential. The structure includes a FET arranged across the capacitor to form a bridged capacitor by having a FET source connected to the first end of the capacitor and a FET drain connected to the second end of the capacitor. A paired activation and subsequent deactivation of the FET enables a short protection mode of the capacitor that provides a series resistance above a threshold amount, between the second potential and the first end of the RRAM cell, responsive to a detected short of the capacitor from the supply to the first potential.

20 Claims, 7 Drawing Sheets

(56) References Cited

U.S. PATENT DOCUMENTS

| | | | |
|---|---|---|---|
| 9,837,154 B2* | 12/2017 | Buchanan | G11C 13/0097 |
| 9,978,938 B2* | 5/2018 | Trinh | H01L 45/1233 |
| 10,127,993 B2 | 11/2018 | Chung et al. | |
| 2012/0223299 A1 | 9/2012 | Liu | |
| 2015/0279479 A1 | 10/2015 | Li et al. | |
| 2019/0305045 A1* | 10/2019 | Sharma | H01L 29/78684 |

* cited by examiner

FAILURE PREVENTION OF CHIP POWER NETWORK

BACKGROUND

The present invention generally relates to semiconductor devices, and more particularly to failure prevention of a chip power network by fuse-like Resistive Random Access Memories (RRAMS). Power distribution network designs are essentially required within electronics and decoupling capacitors (decaps) mainly suppress di/dt noise of the power network. Throughout Very Large Scale Integration (VLSI) fabrication, inevitable processing defects of decaps could lead to catastrophic chip/system failure by shorting power (Vdd) to ground (Vss). Thus, there is a need for an apparatus for failure prevention of chip power networks.

SUMMARY

According to an aspect of the present invention, a semiconductor structure is provided. The semiconductor structure includes a Resistive Random Access Memory (RRAM) cell having a first end and a second end. The second end is connected to a ground voltage. The semiconductor structure further includes a decoupling capacitor having a first end and a second end. The first end of the decoupling capacitor is connected in series with the first end of the RRAM cell. The second end of the decoupling capacitor is connected to a second potential. The semiconductor structure also includes a Field Effect Transistor (FET) arranged across the decoupling capacitor to form a bridged capacitor by having a source of the FET connected to the first end of the decoupling capacitor and a drain of the FET connected to the second end of the decoupling capacitor. A paired activation and subsequent deactivation of the FET enables a short protection mode of the decoupling capacitor. The short protection mode provides a series resistance above a threshold amount, between the second potential and the first end of the RRAM cell, responsive to a detected short of the decoupling capacitor from the second potential to the ground voltage.

According to another aspect of the present invention, a method for providing short protection for a semiconductor structure is provided. The method includes connecting, to a ground voltage, a second end of a Resistive Random Access Memory (RRAM) cell having a first end and the second end. The method further includes connecting, in series with the first end of the RRAM cell, a first end of a decoupling capacitor having the first end and a second end. The method also includes connecting the second end of the decoupling capacitor to a second potential. The method additionally includes arranging a Field Effect Transistor (FET) across the decoupling capacitor to form a bridged capacitor by having a source of the FET connected to the first end of the decoupling capacitor and a drain of the FET connected to the second end of the decoupling capacitor. A paired activation and subsequent deactivation of the FET enables a short protection mode of the decoupling capacitor. The short protection mode provides a series resistance above a threshold amount, between the second potential and the first end of the RRAM cell, responsive to a detected short of the decoupling capacitor from the second potential to the ground voltage.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to failure prevention of a chip power network by fuse-like Resistive Random Access Memories (RRAMS).

In one or more embodiments, RRAM cells are introduced to prevent detrimental shorts between Vdd and Vss of a power distribution network.

An RRAM cell in accordance with an embodiment of the present invention lends itself to power network potential short protection given its two varying resistance statuses (LRS/HRS).

Other advantages of various embodiments of the present invention include RRAM small footprints, a quick switch response, and compatibility to existing processes.

Figure 1:
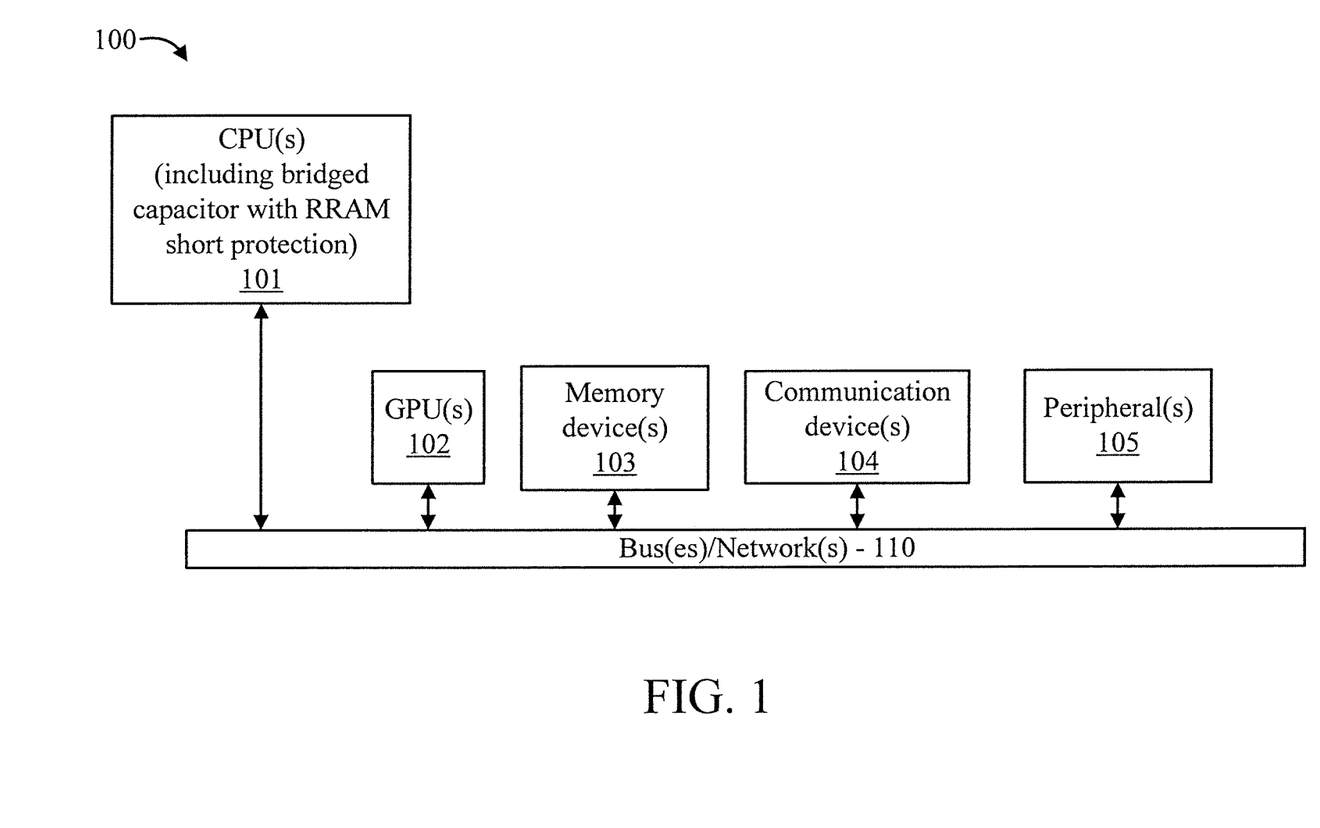
FIG. 1 is a block diagram showing an exemplary processing system, in accordance with an embodiment of the present invention.

FIG. 1 is a block diagram showing an exemplary processing system 100, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

In an embodiment, one or more of the elements of FIG. 1, such as, for example, CPUs 101, GPUs 102, and so forth are implemented as Integrated Circuits (ICs) having a respective power grid with alternating power and ground rails and decoupling capacitors bridged by a respective transistor and coupled in series to a RRAM unit (interchangeably referred to as RRAM cell) for short circuit protection.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

As noted above, one of or more elements (e.g., CPUs, GPUs, etc.) of FIG. 1 include a power grid having alternating power and ground rails with a respective decoupling capacitor connected between a respective Vdd rail and a respective Vss rail. Each respective decoupling capacitor is modified in comparison to the prior art by having a FET bridged over the decoupling capacitor and a RRAM unit connected in series with and between the capacitor and ground. An RRAM is a two-terminal passive device in which a comparatively insulating switching layer is sandwiched between two electrically conducting electrodes (a metal, insulator, metal or MIM stack). However, a working RRAM device generally includes one transistor (1T) or one diode (1D) and one resistor (1R), i.e., 1T1R or 1D1R configurations. In an embodiment, construction of the RRAM includes formation of a top electrode, a transition metal oxide, and a bottom electrode. The top electrode can be formed from, but is not limited to, one or more of the following: Platinum (Pt); Titanium Nitride/Titanium (TiN/Ti); Titanium Nitride (TiN); Ruthenium (Ru); Nickel (Ni); and so forth. The transition metal oxide can be formed from, but is not limited to, one or more of the following: Titanium Oxide (TiOx); Nickel Oxide (NiOx); Hafnium Oxide (HfOx); Tungsten Oxide (WOx); Tantalum Oxide (TaOx); Vanadium Oxide (VOx); Copper Oxide (CuOx); and so forth. The bottom electrode can be formed from, but is not limited to, one or more of the following: Titanium Nitride (TiN); Tantalum Nitride (TaN); Tungsten (W); Platinum (Pt); and so forth. While the preceding materials are mentioned for electrode formation, in other embodiments, other materials can be used. In accordance with embodiments of the present invention, the RRAM is connected to a modified decap (bridged by a MOSFET) arrangement, as described in further detail hereinbelow.

The present invention is directed to decap defects. A decap cell is a temporary capacitor added in the design between power and ground rails to counter the functional failure due to dynamic voltage drop. Dynamic voltage drop includes both resistive IR drop and inductive di/dt noise. Decap defects can include opens and shorts. An open defect denotes low risk, where the chip is still functional, while a short defect denotes high risk, where the chip is likely to be completely inoperable.

Figure 2:
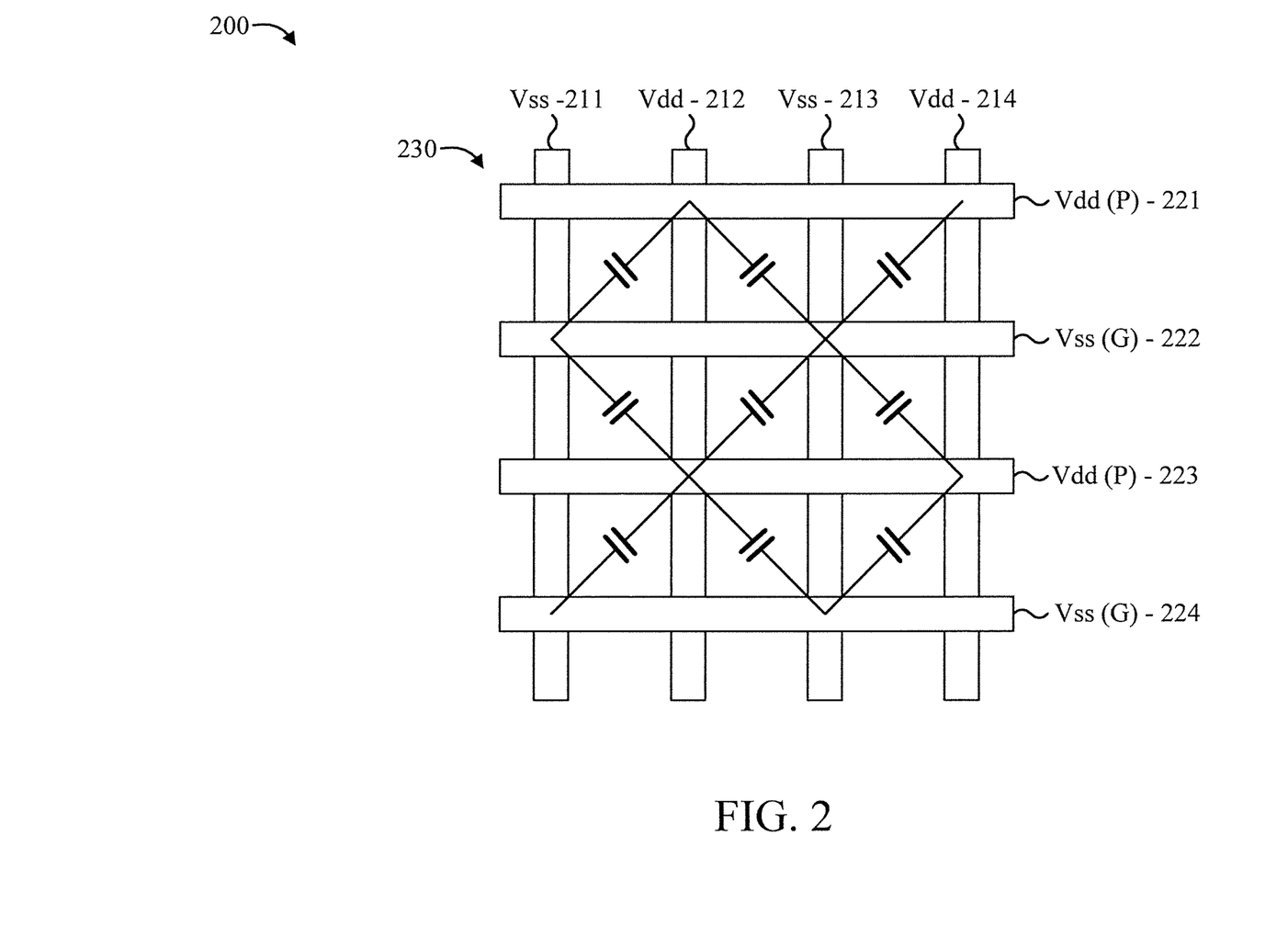
FIG. 2 is a block diagram showing an exemplary power grid for semiconductor Integrated Circuits (ICs), in accordance with an embodiment of the present invention.

FIG. 2 is a block diagram showing an exemplary power grid 200 for semiconductor Integrated Circuits (ICs), in accordance with an embodiment of the present invention.

The power grid 200 includes a Vss column 211, a Vdd column 212, a Vss column 213, and a Vdd column 214. The power grid 200 further includes a Vdd(P) row 221, a Vss(G) row 222, a Vdd(P) row 223, and a Vss(G) row 224. Regarding the designations "(P)" and "(G)", the same denote "power" and "ground", respectively. The power grid 200 additionally includes a respective capacitor, also referred to as a "decoupling capacitor" or "decap cell", in between a respective node in a VSS row or column to a respective node in a Vdd row or column, with the capacitors individually and collectively denoted by the figure reference numeral 230.

The present invention modifies each respective capacitor 230 by placing a transistor (e.g., a Metal Oxide Semiconductor Field Effects Transistor (MOSFET)) across the capacitor 230 and linking one RRAM unit. In particular, the source and drain of a respective MOSFET are coupled across the two terminals of each of the capacitors 230. In an embodiment, a N-channel, enhancement-type MOSFET is used. In other embodiments, other types of transistors can be used. An RRAM unit is then inserted between one terminal of the capacitor 230 and Vss node.

Figure 3:
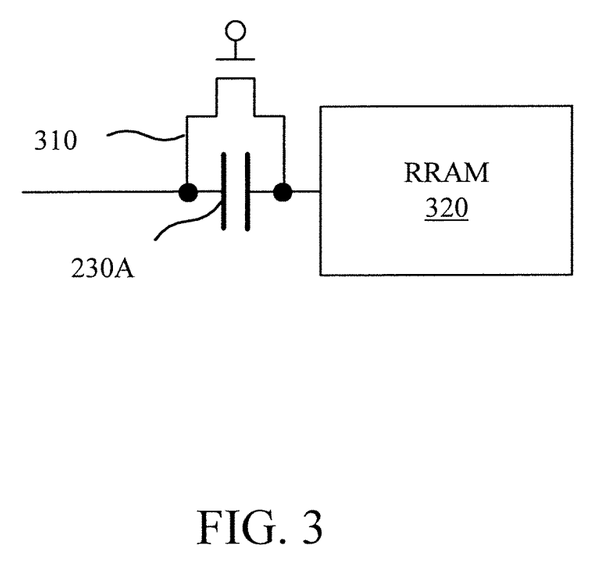
FIG. 3 is a schematic diagram showing an exemplary modified decap cell capacitor with an RRAM unit for a power grid, in accordance with an embodiment of the present invention.

FIG. 3 is a schematic diagram showing an exemplary modified decap cell capacitor 230A with a RRAM unit 320 for a power grid, in accordance with an embodiment of the present invention.

The capacitor 230A is modified by the adding of a MOSFET 310 across the terminals of the capacitor 230A. The figure reference numeral 230A thus represents a capacitor 200 modified to include a MOSFET 310 bridged thereover. In particular, the source and drain of the MOSFET 310 are coupled to the first and second terminals, respectively, of the capacitor 230A. RRAM 320 denotes a fuse-like unit connected in series to the decap cell capacitor 230A. Thus, a switch is formed across the capacitor 230A in between a power rail Vdd and a ground voltage Vss.

Thus, each of the capacitors 230 in FIG. 2 is modified to form a modified capacitor 230A bridged by a respective MOSFET 310, further connecting to a fuse-like RRAM unit 320.

Figure 4:
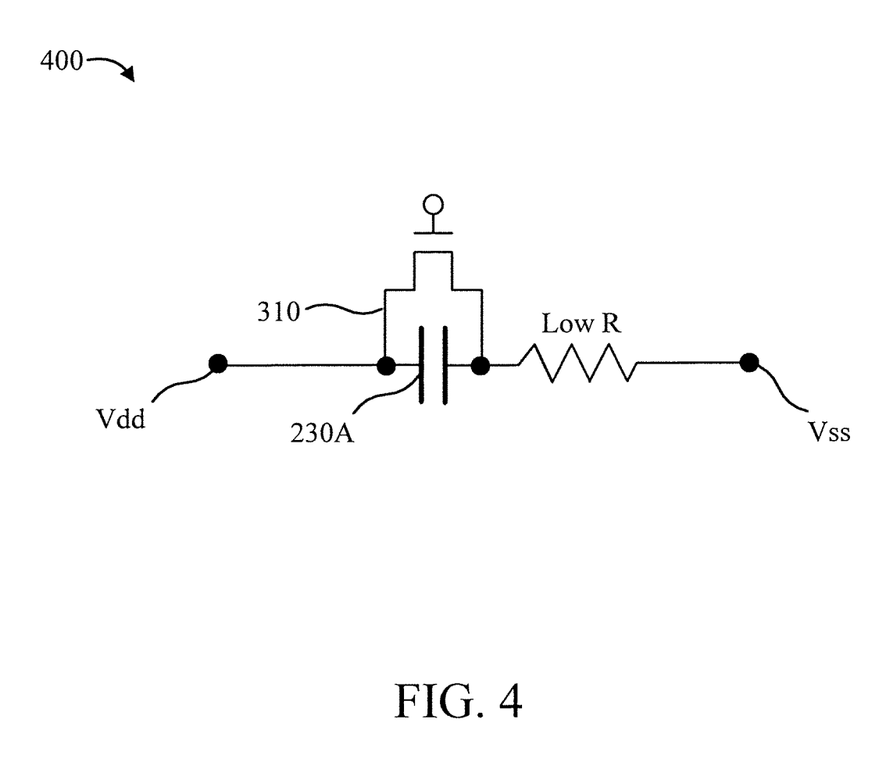
FIG. 4 is a schematic diagram showing an exemplary normal operation of the modified decap cell capacitor of FIG. 3, in accordance with an embodiment of the present invention.

FIG. 4 is a schematic diagram showing an exemplary normal operation 400 of the modified decap cell capacitor 230A of FIG. 3, in accordance with an embodiment of the present invention.

During the normal operation 400, the corresponding resistance R between the Vdd node 401 and the Vss node 402 is low (Low Resistance State (LRS), e.g., this LRS status was initially set by turning on the switch MOSFET 310 (e.g., a high voltage is briefly applied to the gate terminal of N-channel MOSFET here), thus currents from Vdd will flow through MOSFET 310 and then RRAM unit 320 where the filament was built in transition metal oxide to form a low resistive path towards the Vss node. After this one-time initialization step, the switch MOSFET 310 is turned off and LRS status remains until any short failures occurred inside decap cell 230A.

Figure 5:
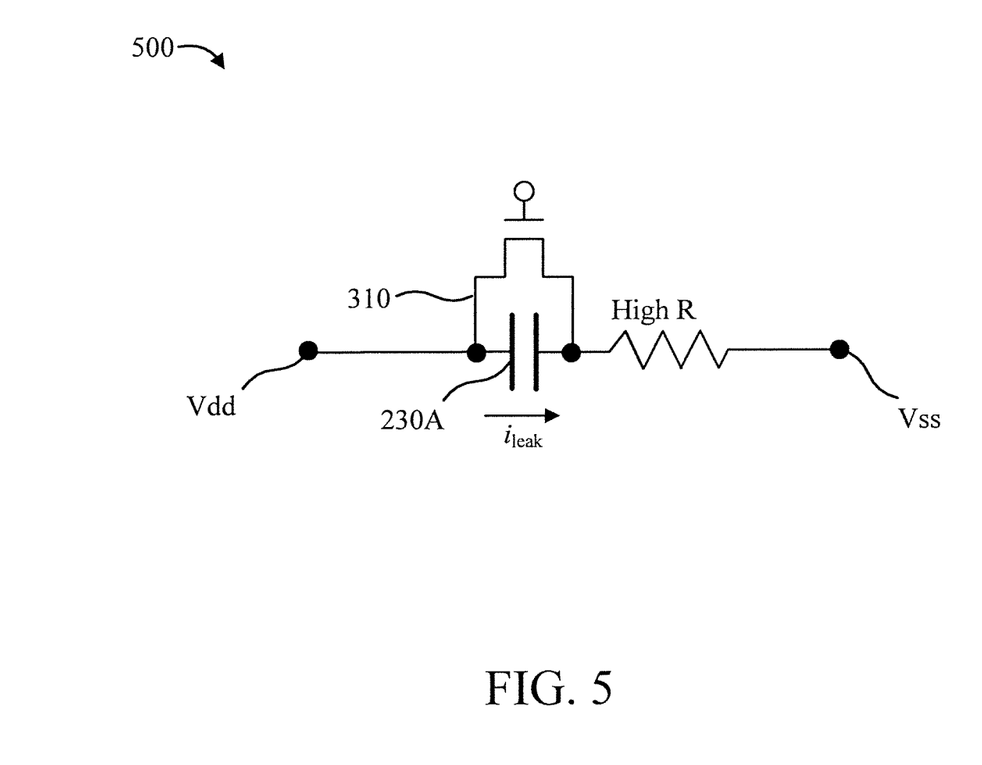
FIG. 5 is a schematic diagram showing an exemplary short protection operation of the modified decap cell capacitor of FIG. 3, in accordance with an embodiment of the present invention.

FIG. 5 is a schematic diagram showing an exemplary short protection operation 500 of the modified decap cell capacitor 230A of FIG. 3, in accordance with an embodiment of the present invention.

During the short protection operation 500, if the decap cell 320A is unfortunately short-circuited for some unexpected reasons (like electrode bridging defects, pinholes inside decap cell dielectrics or other manufacturing damages), then the current injecting into RRAM increases abruptly and so does the input terminal voltage of RRAM unit 320, e.g., jumping from almost the Vss level in LRS aforementioned to close to Vdd now. This detection will quickly trigger the RRAM to enter the protection mode by resetting its LRS to the High Resistance State (HRS), hence suppressing a large $i_{leak}$ current flowing through, behaving like a fuse to prevent the power supply Vdd from shorting to the ground Vss.

Figure 6:
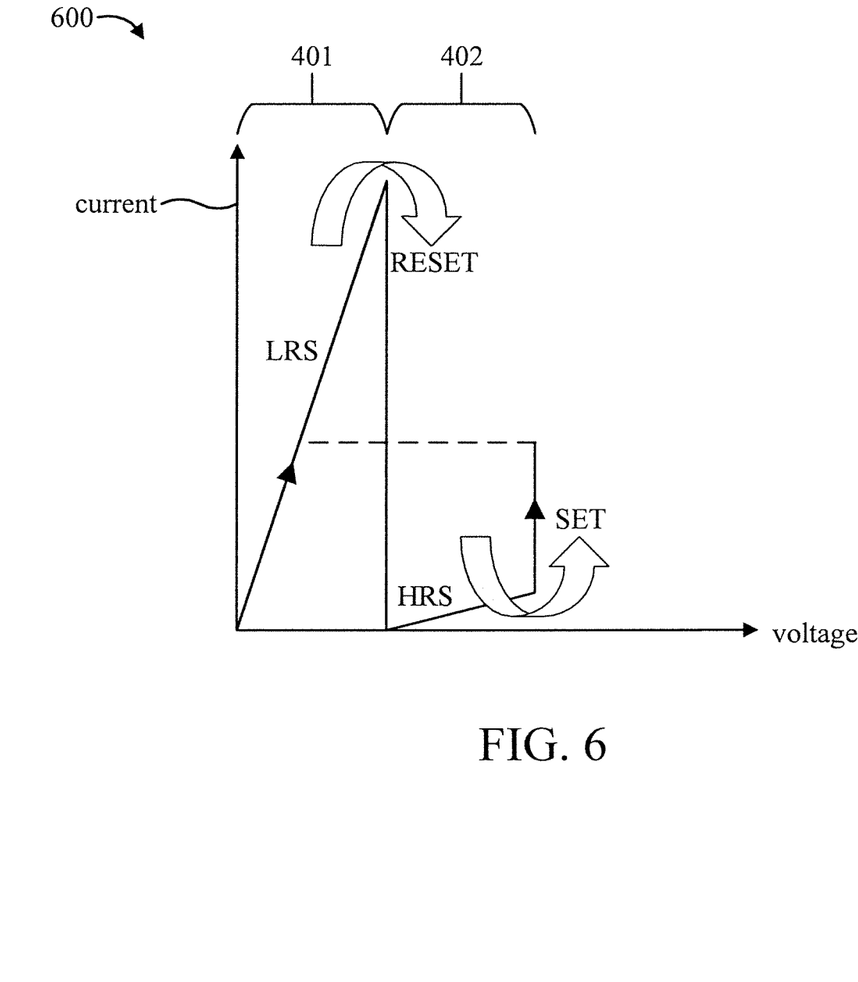
FIG. 6 is a diagram showing an exemplary plot of RRAM voltage versus current for both a normal operation and a short protection operation of the modified decap cell capacitor of FIG. 3, in accordance with an embodiment of the present invention.

FIG. 6 is a diagram showing an exemplary plot 600 of RRAM voltage versus current for both a normal operation 400 and a short protection operation 500 of the modified decap cell capacitor 230A of FIG. 3, in accordance with an embodiment of the present invention. As the modified decoupling capacitor 230A is connected to a respective attached RRAM cell, the plot 600 can be considered a current-voltage (I-V) curve for the attached RRAM cell.

The plot 600 includes a normal operation region 401 corresponding to the normal operation 400 and a short protection region 402 corresponding to the short protection operation 500.

The normal operation region 401 relates to a Low Resistance State (LRS) of RRAM unit 320 serially connected to the modified decap cell capacitor 230A.

The short protection region 402 relates to a High Resistance State (HRS) of RRAM unit 320 serially connected to the modified decap cell capacitor 230A.

A reset enables a transition from the LRS to the HRS.

Figure 7:
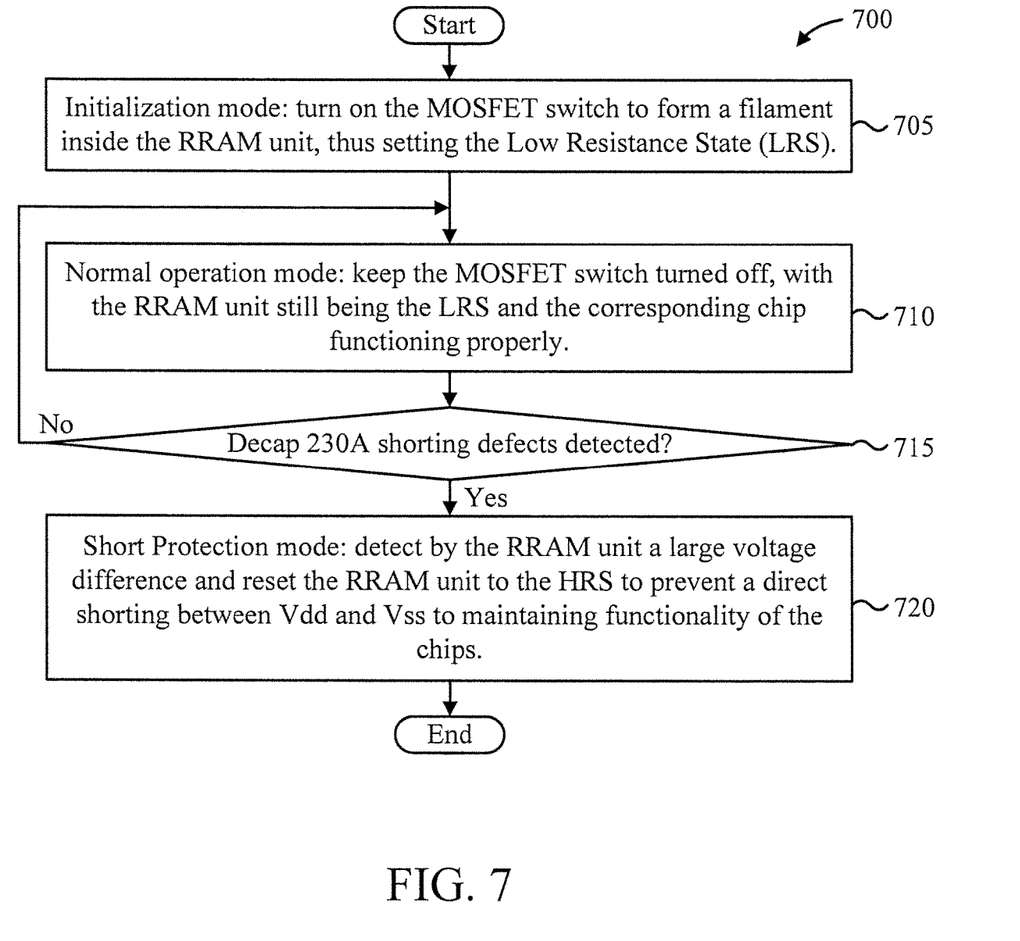
FIG. 7 is a flow diagram showing an exemplary method for operating the modified decap cell capacitor of FIG. 3, in accordance with an embodiment of the present invention.

FIG. 7 is a flow diagram showing an exemplary method 700 for operating the modified decap cell capacitor of FIG. 3, in accordance with an embodiment of the present invention.

At block 705, corresponding to an initialization mode, turn on the MOSFET switch to form a filament inside the RRAM unit, thus setting the Low Resistance State (LRS).

At block 710, corresponding to a normal operation mode, keep the MOSFET switch turned off, with the RRAM unit still being the LRS and the corresponding chip functioning properly.

At block 715, determine whether or not there are any decap 230A shorting defects are detected. If so, then proceed to block 720. Otherwise, return to block 710.

At block 720, corresponding to a short protection mode, detect by the RRAM unit a large voltage difference and reset the RRAM unit to the HRS to prevent a direct shorting between Vdd and Vss to maintaining functionality of the chips.

A description will now be given regarding various features of the use of "1 transistor+1 RRAM", in accordance with various embodiments of the present invention.

Various features include the following:

"1 Transistor+1 RRAM" scalability→power grid design will scale down as semiconductor technology node advances, so follows this "1 Transistor+1 RRAM" unit footprint;

"1 Transistor+1 RRAM" adaptability to all electronic power grids→easily applicable to any uniform/non-uniform, global/local, digital/analog/mixed-signal IC power meshes;

"1 Transistor+1 RRAM" process compatibility→mainstream and cost-effective CMOS fabrication compatible "1 Transistor+1 RRAM" multiple power domain suitability→besides the nominal operational voltage, this structure can fit any other supply voltages clamped by voltage regulators as long as RRAM's breakdown voltage does not exceed that lifted voltage; and "1 Transistor+1 RRAM" switch transistor alternatives→ntype/ptype MOSFET, pnp/npn BJT, other III-V/II-VI compound or even carbon based FETs (carbon nanotube/graphene FETs), transmission gate.

The preceding are merely some of the many attendant benefits of the present invention.

A description will now be given regarding a unipolar switching mode, in accordance with an embodiment of the present invention.

In unipolar resistive switching mode, the switching direction does not depend on the polarity of the applied voltage and generally occurs at higher voltage amplitude that of bipolar switching. A pristine memory device with high initial resistance state (IRS) can be switched in to a low-resistance state (LRS) by applying a high voltage stress. This process is called the "electroforming process" or simply "forming process" and alters the resistance of the pristine device irreversibly. Some RRAM devices do not need the forming process and are called forming-free devices. Forming-free devices are highly required for RRAM practical application. After the forming process, the RRAM device can be switched to a high-resistance state (HRS), generally lower than that of the IRS by the application of a particular voltage called reset voltage. This process is called "RESET process." Switching from a HRS to a LRS called "SET." In the SET process, generally, the current is limited by the current compliance (CC) in order to avoid device damage. The resistive switching in unipolar mode has been observed in many highly insulating oxides, such as binary metal oxides.

A description will now be given regarding the resistive switching mechanism used an RRAM, in accordance with an embodiment of the present invention.

Generally, depending on the conduction path, the switching mechanism used here can be classified as filamentary-type. In the filamentary model, the switching originates from the formation/rupture of conducting filament in the switching material by the application of suitable external bias. The filamentary paths are formed under SET and ruptured under RESET. Electrochemical migration of oxygen ions and redox reaction near the metal/oxide interface is widely considered as the possible mechanism behind the formation and rupture of the filaments.

In general, if the resistance of the LRS is independent of the device area and HRS varies inversely, the switching is filamentary.

Depending on the switching material and electrodes, the resistive switching memory can be divided into two types: cation-based switching called electrochemical metallization (ECM) memory and anion-based switching called valance change memory (VCM). In cation-based memory, a solid-electrolyte was used as a switching material and an electrochemically active metal such as copper (Cu), silver (Ag), and Nickel (Ni) as the Top Electrode (TE) and an inert metal as the Bottom Electrode (BE). Generally, the ions of Cu and Ag were known as mobile ions. When positive voltage was applied on the Cu TE, for example, metallic Cu was reduced electrochemically to give Cu+ ions generated from metallic Cu due to anodic dissolution. These ions then diffused through the solid electrolyte due to electric field and reached to the BE where these ions reduced to become metallic Cu and electro-crystallize on the BE. As a result, a conducting filament grew preferentially from the BE and finally bridge the BE and TE. Consequently, the device switched to the LRS. That is the reason that ECM devices were also called conducting bridge RAM. When negative voltage was applied on the TE electrode, the Cu filament broken due to electrochemical dissolution reaction initiated by an electronic current through the metallic bridge, and, in parallel, an electrochemical current and the device came into HRS. In recent years, many solid electrolyte materials were reported. The VCM devices includes a sub-stoichiometric switching material and an inert electrode or reactive electrode. In VCM devices, switching occurs due to the redox reaction induced by anion (O2-) migration to form conducting filament. These devices usually need a forming step in order to switch between LRS and HRS reversibly. During electroforming process, the generation of oxygen O2-ions occurs in the switching material due to chemical bond breaking. The generated O2-ions migrate toward the TE under the external bias, and oxygen gas evolution at the anode due to anodic reaction are also reported in literature. To maintain the charge neutrality, the valance state of the cations changes. Therefore, it is called VCM memory. Due to O2-ion generation and anodic reaction, oxygen vacancy conducting path generates in the switching material between TE and BE, and device switches to LRS. The electroforming conditions strongly depend on the dimension of the sample, in particular, the switching material thickness. In addition, thermal effects play an essential role in the electroforming, and it sometimes damage the devices by introducing morphological changes. Partially blown electrodes during forming have been observed. Thus, the high-voltage forming step needs to be eliminated in order to product the RRAM devices in future. However, anion-based switching material with combination of different electrode materials and interface engineering will have good flexibility to obtain proper RRAM device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure, comprising:
a Resistive Random Access Memory (RRAM) cell having a first end and a second end, the second end being connected to a first potential;
a decoupling capacitor having a first end and a second end, the first end being connected in series with the first end of the RRAM cell, the second end being connected to a second potential; and
a Field Effect Transistor (FET) arranged across the decoupling capacitor to form a bridged capacitor by having a source of the FET connected to the first end of the decoupling capacitor and a drain of the FET connected to the second end of the decoupling capacitor,
wherein a paired activation and subsequent deactivation of the FET enables a short protection mode of the decoupling capacitor, the short protection mode providing a series resistance above a threshold amount, between the second potential and the first end of the RRAM cell, responsive to a detected short of the decoupling capacitor from the second potential to the first potential.

2. The semiconductor structure of claim 1, wherein the FET is a Metal Oxide Semiconductor FET.

3. The semiconductor structure of claim 1, wherein the decoupling capacitor, the RRAM cell, and the FET are comprised in a power grid.

4. The semiconductor structure of claim 3, wherein the power grid has alternating rows and columns of power and supply rails between which the decoupling capacitor is connected.

5. The semiconductor structure of claim 4, wherein the short protection mode protects the power grid from failing due to the detected short of the decoupling capacitor.

6. The semiconductor structure of claim 5, wherein the RRAM cell and the FET are collectively configured to operate as a fuse for the decoupling capacitor short.

7. The semiconductor structure of claim 1, wherein the activation of the FET initially forms a filament inside the RRAM cell to set a low resistance state and then the FET is deactivated.

8. The semiconductor structure of claim 1, wherein the activation enables a normal operation mode corresponding to a low resistance state and the detected short of the decoupling capacitor enables the RRAM cell to enter the short protection mode corresponding to a high resistance state having a higher resistance than the low resistance state.

9. The semiconductor structure of claim 1, wherein the semiconductor structure is embodied in an integrated circuit.

10. The semiconductor structure of claim 1, wherein the semiconductor structure is embodied in a power network having a power grid including a plurality of RRAM cells, wherein the RRAM cells are unused for storage and used for fuse protection of the decoupling capacitor.

11. A method for providing short protection for a semiconductor structure, comprising:

connecting, to a first potential, a second end of a Resistive Random Access Memory (RRAM) cell having a first end and the second end;

connecting, in series with the first end of the RRAM cell, a first end of a decoupling capacitor having the first end and a second end;

connecting the second end of the decoupling capacitor to a second potential; and arranging a Field Effect Transistor (FET) across the decoupling capacitor to form a bridged capacitor by having a source of the FET connected to the first end of the decoupling capacitor and a drain of the FET connected to the second end of the decoupling capacitor, wherein a paired activation and subsequent deactivation of the FET enables a short protection mode of the decoupling capacitor, the short protection mode providing a series resistance above a threshold amount, between the second potential and the first end of the RRAM cell, responsive to a detected short of the decoupling capacitor from the second potential to the first potential.

12. The method of claim 11, wherein the FET is a Metal Oxide Semiconductor FET.

13. The method of claim 11, further comprising including the decoupling capacitor, the RRAM cell, and the FET in a power grid.

14. The method of claim 13, further comprising arranging the power grid to have alternating rows and columns of power and supply rails between which the decoupling capacitor is connected.

15. The method of claim 14, wherein the short protection mode protects the power grid from failing due to the detected short of the decoupling capacitor.

16. The method of claim 15, wherein the RRAM cell and FET are collectively configured to operate as a fuse for the decoupling capacitor short.

17. The method of claim 11, further comprising configuring the RRAM cell to switch between a normal operation mode corresponding to a low resistance state and the short protection mode corresponding to a high resistance state having a higher resistance than the low resistance state.

18. The method of claim 11, wherein the activation enables a normal operation mode corresponding to a low resistance state and the detected short of the decoupling capacitor enables the RRAM cell to enter the short protection mode corresponding to a high resistance state having a higher resistance than the low resistance state.

19. The method of claim 11, further comprising forming the semiconductor structure in an integrated circuit.

20. The method of claim 11, further comprising forming the semiconductor structure in a power network having a power grid including a plurality of RRAM cells, wherein the RRAM cells are unused for storage and used for fuse protection of the decoupling capacitor.

* * * * *